United States Patent
Coss, Jr. et al.

(10) Patent No.: US 6,465,263 B1
(45) Date of Patent: *Oct. 15, 2002

(54) METHOD AND APPARATUS FOR IMPLEMENTING CORRECTED SPECIES BY MONITORING SPECIFIC STATE PARAMETERS

(75) Inventors: Elfido Coss, Jr., Austin, TX (US); Thomas Sonderman, Austin, TX (US); Robert W. Anderson, Austin, TX (US)

(73) Assignee: Advanced Micro Devices, Inc., Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/477,252

(22) Filed: Jan. 4, 2000

(51) Int. Cl.[7] ........................ G01R 3/126; H01L 21/166
(52) U.S. Cl. ........................................................ 438/14
(58) Field of Search .............................. 438/14, 16, 17, 438/18

(56) References Cited

U.S. PATENT DOCUMENTS

| | | | | |
|---|---|---|---|---|
| 5,179,333 A | * | 1/1993 | Washizuki et al. | 438/13 |
| 5,219,765 A | * | 6/1993 | Yoshida et al. | 437/8 |
| 5,576,629 A | * | 11/1996 | Turner et al. | 324/709 |
| 5,667,629 A | * | 9/1997 | Pan et al. | 438/13 |
| 5,886,896 A | * | 3/1999 | Lantz et al. | 364/468.23 |
| 5,913,102 A | * | 6/1999 | Yang | 438/14 |
| 5,963,881 A | * | 10/1999 | Kahn et al. | 702/35 |
| 6,130,542 A | * | 10/2000 | Syo | 324/719 |
| 6,153,444 A | * | 11/2000 | Nakano et al. | 438/16 |
| 6,165,805 A | * | 12/2000 | Steffan et al. | 438/14 |
| 6,303,395 B1 | * | 10/2001 | Nulman | 438/14 |

* cited by examiner

*Primary Examiner*—John F. Niebling
*Assistant Examiner*—Viktor Simkovic
(74) *Attorney, Agent, or Firm*—Williams, Morgan & Anderson, P.C.

(57) ABSTRACT

The present invention provides for a method and an apparatus for implementing corrected species by monitoring state parameters in a manufacturing process. A process run of semiconductor devices is performed. Production data relating to the process run of semiconductor devices is acquired. The acquired production data is stored into a production database. A recipe management analysis is performed. The apparatus of the present invention comprises: a recipe management system; a first machine interface connected to said recipe management system; a processing tool connected to said first machine interface; and a fault detection system connected to said first machine interface.

17 Claims, 5 Drawing Sheets

METHOD AND APPARATUS FOR IMPLEMENTING CORRECTED SPECIES BY MONITORING SPECIFIC STATE PARAMETERS

This is a continuing prosecution application (CPA) of application Ser. No. 09/477,452, filed Jan. 4, 2000.

BACKGROUND OF THE INVENTION

1. Field of the Invention

This invention relates generally to semiconductor products manufacturing, and, more particularly, to a method and apparatus for correcting species for semiconductor manufacturing processes by monitoring state parameters.

2. Description of Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the important control aspects in semiconductor device manufacturing are implant process control, rapid thermal anneal (RTA) control, chemical-mechanical polishing (CMP) control, and overlay control. Overlay is one of several important steps in the photolithography area of semiconductor manufacturing. Overlay control involves measuring the misalignment between two successive patterned layers on the surface of a semiconductor device. Generally, minimization of misalignment errors is important to ensure that the multiple layers of the semiconductor devices are connected and functional. As technology facilitates smaller critical dimensions for semiconductor devices, the need for reduction of misalignment errors increases dramatically.

Generally, photolithography and implant process engineers currently analyze errors a few times a month. The results from the analysis of the errors are used to make updates to processing tool settings manually. Technical personnel who are responsible for overseeing implant processes generally make modification to a process tool, load a process recipe into the process tool, and check control parameters that are defined by the process recipe. Generally, a manufacturing model is employed to control the manufacturing processes. Some of the problems associated with the current methods include the fact that the aforementioned steps can be compromised by errors that can occur in each of the steps. Furthermore, currently the implant process tools and exposure tool updates are performed manually or semi-automatically. Many times, errors in semiconductor manufacturing are not organized and reported to quality control personnel. Often, the manufacturing models themselves incur bias errors that could compromise manufacturing quality.

Generally, a set of processing steps is performed on a lot of wafers on a semiconductor manufacturing tool called an implant tool. The manufacturing tool communicates with a manufacturing framework or a network of processing modules. The manufacturing tool is generally connected to an equipment interface. The equipment interface is connected to a machine interface to which the implanter is connected, thereby facilitating communications between the implant tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices. Many times, errors in semiconductor manufacturing are not organized and reported to quality control personnel, which can result in reduced efficiency in manufacturing processes. Errors in manufacturing model, errors in the recipe, errors in the tool setup, such as species, or mismatch of recipe to process tool can cause poor manufacturing results.

The present invention is directed to overcoming, or at least reducing the effects of, one or more of the problems set forth above.

SUMMARY OF THE INVENTION

In one aspect of the present invention, a method is provided for implementing corrected species by monitoring state parameters in a manufacturing process. A process run of semiconductor devices is performed. Production data relating to the process run of semiconductor devices is acquired. The acquired production data is stored into a production database. A recipe management analysis is performed.

In another aspect of the present invention, an apparatus is provided for implementing corrected species by monitoring state parameters in a manufacturing process. The apparatus of the present invention comprises: a recipe management system; a first machine interface connected to said recipe management system; a processing tool connected to said first machine interface; and a fault detection system connected to said first machine interface.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. As semiconductor devices are processed through manufacturing tools, production data, or manufacturing data, is generated. The production data can be used to perform fault detection analysis that can lead to improved manufacturing results. Implant processes and overlay processes are important groups of process steps in semiconductor manufacturing. In particular, overlay process involves measuring misalignment errors between semiconductor layers during manufacturing processes. Improvements in the overlay process could result in substantial enhancements, in terms of quality and efficiency, in semiconductor manufacturing processes. For implant processes, analysis of the process recipe and trace data can be utilized to perform correction of implant processes. The present invention provides a method of utilizing a recipe database to more accurately set up the control systems for a particular tool. Furthermore, the present invention provides a method for acquiring production data and performing fault analysis on a process controller, such as a run-to-run controller, in response to the acquired production data.

Figure 1:
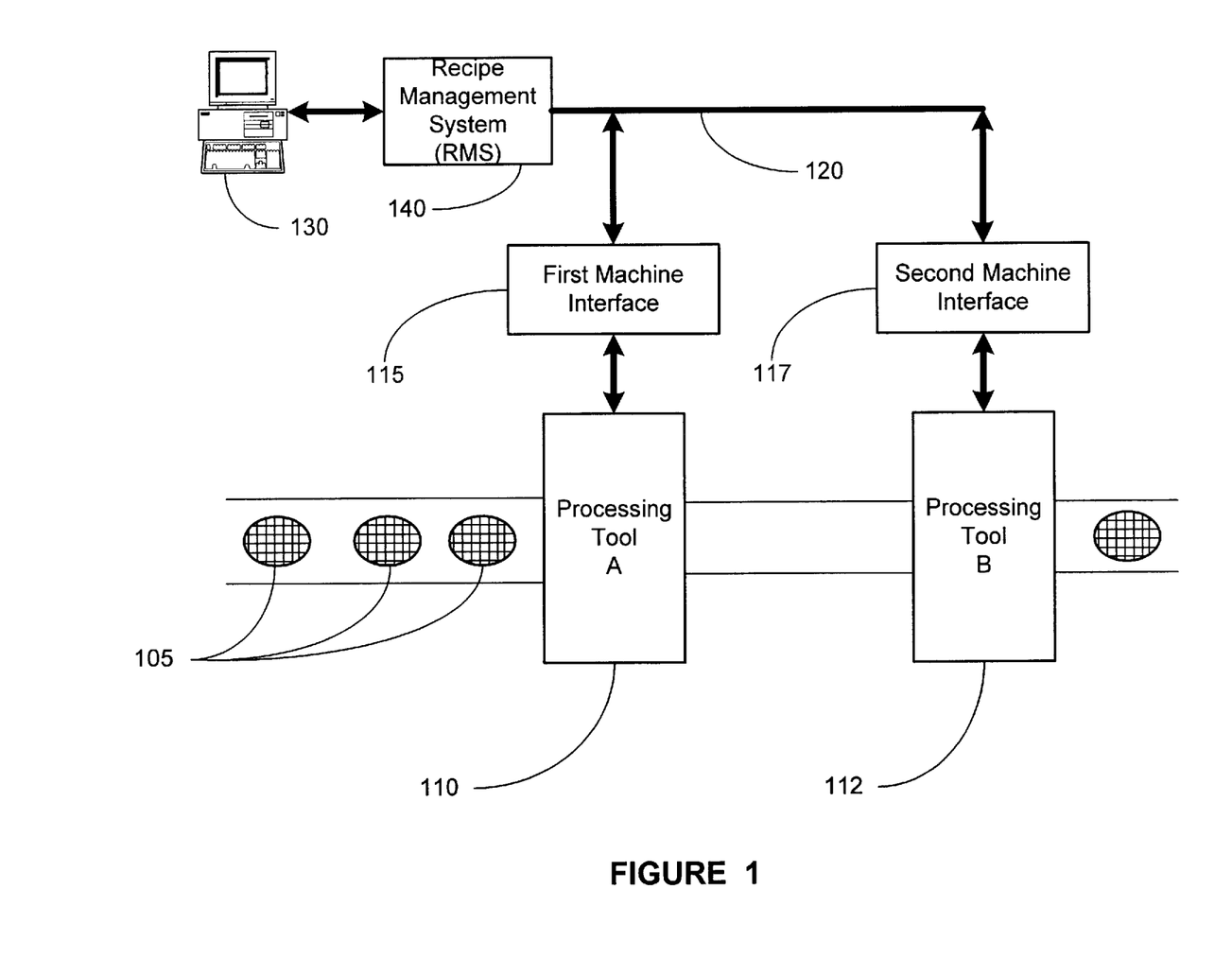
FIG. 1 illustrates one embodiment of the present invention.

Turning now to FIG. 1, one embodiment of the present invention is illustrated. In one embodiment, semiconductor products 105, such as semiconductor wafers are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the computer system 130 is integrated with a manufacturing process control system (not shown), such as an Advanced Process Control (APC) system. In one embodiment, the first and second machine interfaces 115, 117 are located outside the processing tools 110, 112. In an alternative embodiment, the first and second machine interfaces 115, 117 are located within the processing tools 110, 112.

In one embodiment, the computer system 130 sends control input signals on a line 120 to the first and second machine interfaces 115, 117. The computer system 130 employs a recipe management system (RMS) 140 to generate the control input signals on the line 120. In one embodiment, the recipe management system is a computer software program that is integrated with a manufacturing process control system such as the APC system. In one embodiment, the recipe management system 140 is used to define a process script and input control that implement a particular manufacturing process. The control input signals on a line 120 that are intended for processing tool A 110 are received and processed by the first machine interface 115. The control input signals on a line 120 that are intended for processing tool B 112 are received and processed by the second machine interface 117. Examples of the processing tools 110, 112 used in semiconductor manufacturing processes are steppers.

For processing tools such as steppers, the control inputs, on the line 120, that are used to operate the processing tools 110, 112 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool. One of the primary features taught by the present invention is a method of detecting and organizing fault data for semiconductor manufacturing processes.

For photolithography processes, when a process step in a processing tool 110, 112 is concluded, the semiconductor product 105 or wafer that is being processed is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs for a particular exposure process, The control inputs generally affect the accuracy of the process steps performed by the processing tools 110, 112 on the semiconductor wafer. Modifications of the control inputs can be utilized to improve the performance of the process steps employed in the manufacturing tool. Many times, the errors that are found in the processed semiconductor products 105 can be correlated to a particular fault analysis and corrective actions can be taken to reduce the errors.

For processing tools such as implant process tools, the control inputs, on the line 120, that are used to operate the processing tools 110, 112 are modified to produce manufacturing results with higher precision. The control inputs on the line 120 used to control implant process tools include doping angle control, doping material concentration level control, doping time period control, doping temperature control, p-type doping control and n-type doping control. The control inputs on the line 120 used for controlling implant process can be manipulated to produce corrections during manufacturing of semiconductor devices.

Figure 2:
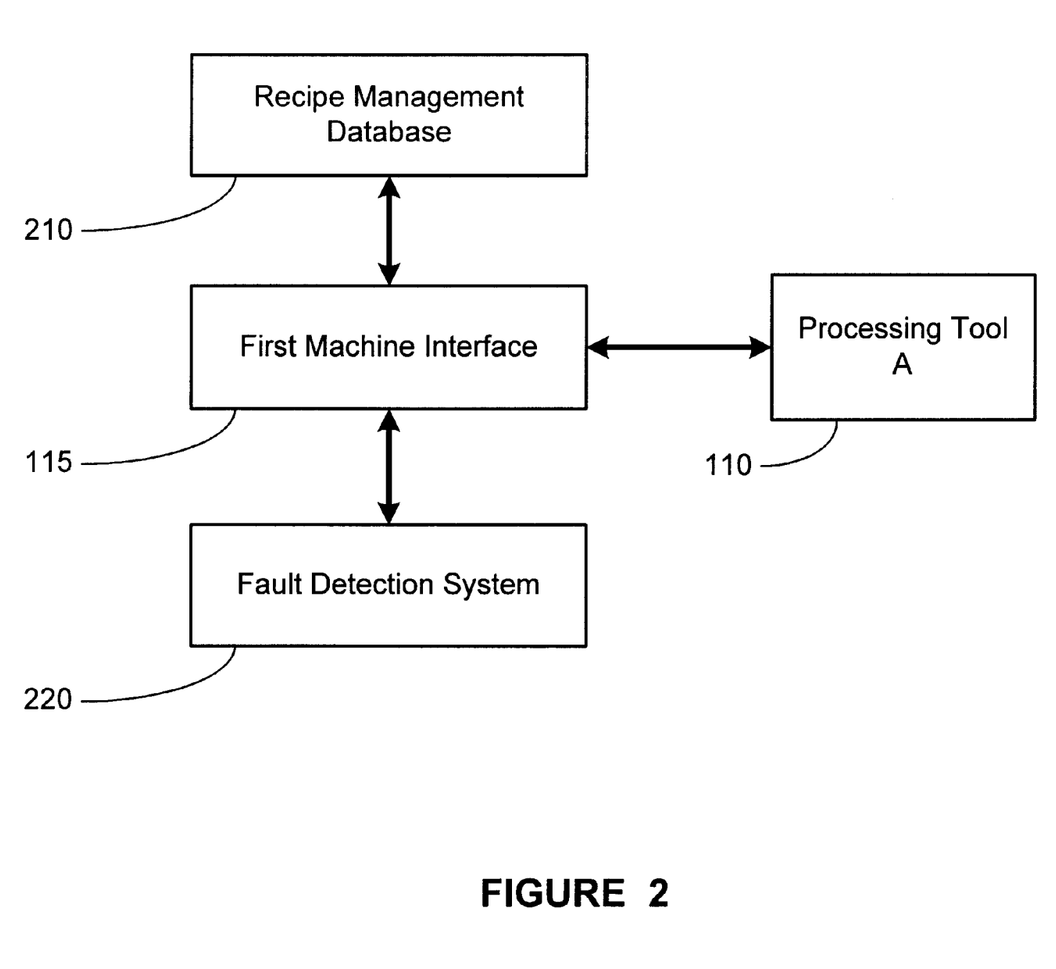
FIG. 2 illustrates one embodiment of an implementation the recipe management system illustrated in FIG. 1.

Turning now to FIG. 2, a block diagram representation of one embodiment of an implementation the recipe management system 140 is illustrated. In one embodiment, a recipe management database 210, which includes process recipes for a plurality of semiconductor manufacturing processes, is interfaced with the first machine interface 115. The process recipe is downloaded to the processing tool A 110 via the first machine interface 115. In one embodiment, as the processing tool A 110 performs a semiconductor manufacturing process, as defined by the downloaded process recipe, trace data is extracted from the processing tool A 110 by the first machine interface 115.

The trace data that is extracted from the processing tool A 110 is then sent to a fault detection system 220. The fault detection system 220 utilized by the present invention is of conventional design and known to those skilled in the art. In one embodiment, the fault detection system 220 analyzes the trace data along with other production data and performs modifications to the manufacturing process, including modifications to the process recipe and matching of recipe species to the particular processing tool 110, 112.

Figure 3:
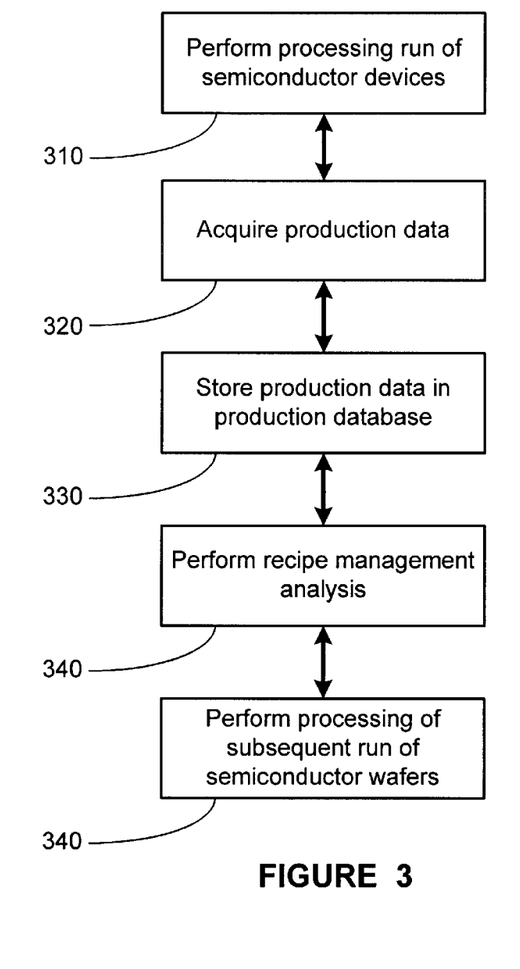
FIG. 3 illustrates a flowchart representation of the methods taught by the present invention.

Turning now to FIG. 3, a flowchart depiction of one embodiment of the methods taught by the present invention is illustrated. In one embodiment, a manufacturing run of semiconductor devices, such as semiconductor wafers, is performed, as described in block 310 of FIG. 3. Once at least one manufacturing run of semiconductor devices is performed, production data resulting from the manufacturing of semiconductor devices is acquired, as described in block 320 of FIG. 3. In one embodiment, production data that is acquired is stored into a production database (not shown), as described in block 330 of FIG. 3. In one embodiment, the production database is accessible by a manufacturing process controller (not shown) such as the Advanced Process Control (APC) system (not shown).

Figure 4:
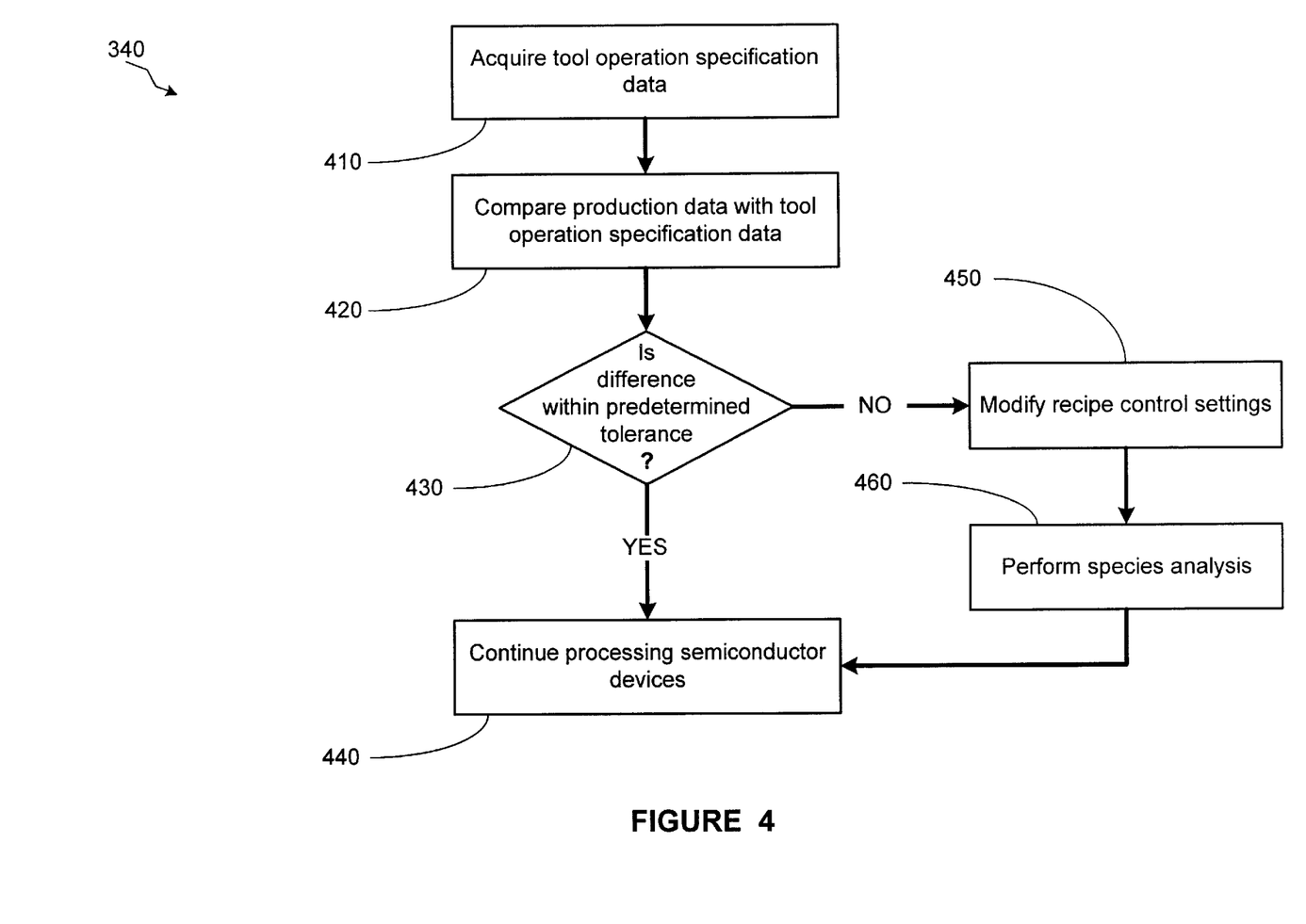
FIG. 4 illustrates a flowchart representation of a more detailed depiction of the step of performing recipe management analysis described in FIG. 3.

Once production data is acquired, stored in the production database, and made available to a manufacturing process control system, such as the APC system, a recipe management analysis is performed, as described in block 340 of FIG. 3. A more detailed embodiment of the step of performing recipe management analysis described in FIG. 3 is illustrated in FIG. 4. In one embodiment, the process described in FIG. 3 is performed by a computer software program. In one embodiment, the computer software program that performs the process described in FIG. 3 is integrated with a manufacturing process control system, such as the APC system.

Turning now to FIG. 4, a set of tool operation specification data, which relates to a particular manufacturing process being performed, is acquired, as described in block 410 of FIG. 4. In one embodiment, the tool operation specification data comprises the process recipe used to perform a particular manufacturing process, the control settings that are used to perform a particular manufacturing process, the period of time for an exposure process, the dosage of semiconductor material to be used for an implant process, and the like. In one embodiment, the tool operation specification data can be used to predict a trace parameter value for a certain manufacturing step.

Once the tool operation specification data is acquired, the specification data is compared to a corresponding set of production data that was acquired, as described in block 420 of FIG. 4. In one embodiment, a determination is made whether the relative difference between the acquired production data relating to a manufacturing process step and the acquired tool operation specification data is within an acceptable predetermined tolerance, as described in block 430 of FIG. 4. When a determination is made that the relative difference between the acquired production data relating to a manufacturing process step and the acquired tool operation specification data is within an acceptable predetermined tolerance, processing of semiconductor devices is generally resumed, as described in block 440 of FIG. 4.

When a determination is made that the relative difference between the acquired production data relating to a manufacturing process step and the acquired tool operation specification data is not within an acceptable predetermined tolerance, the process recipe control settings for the manufacturing process step are modified, as described in block 450 of FIG. 4. A species analysis for the present manufacturing process step is performed, as described in block 460 of FIG. 4. Subsequently, processing of semiconductor devices is generally resumed, as described in block 440 of FIG. 4. A more detailed depiction of the step of performing species analysis described in block 460 of FIG. 4 is illustrated in FIG. 5.

Figure 5:
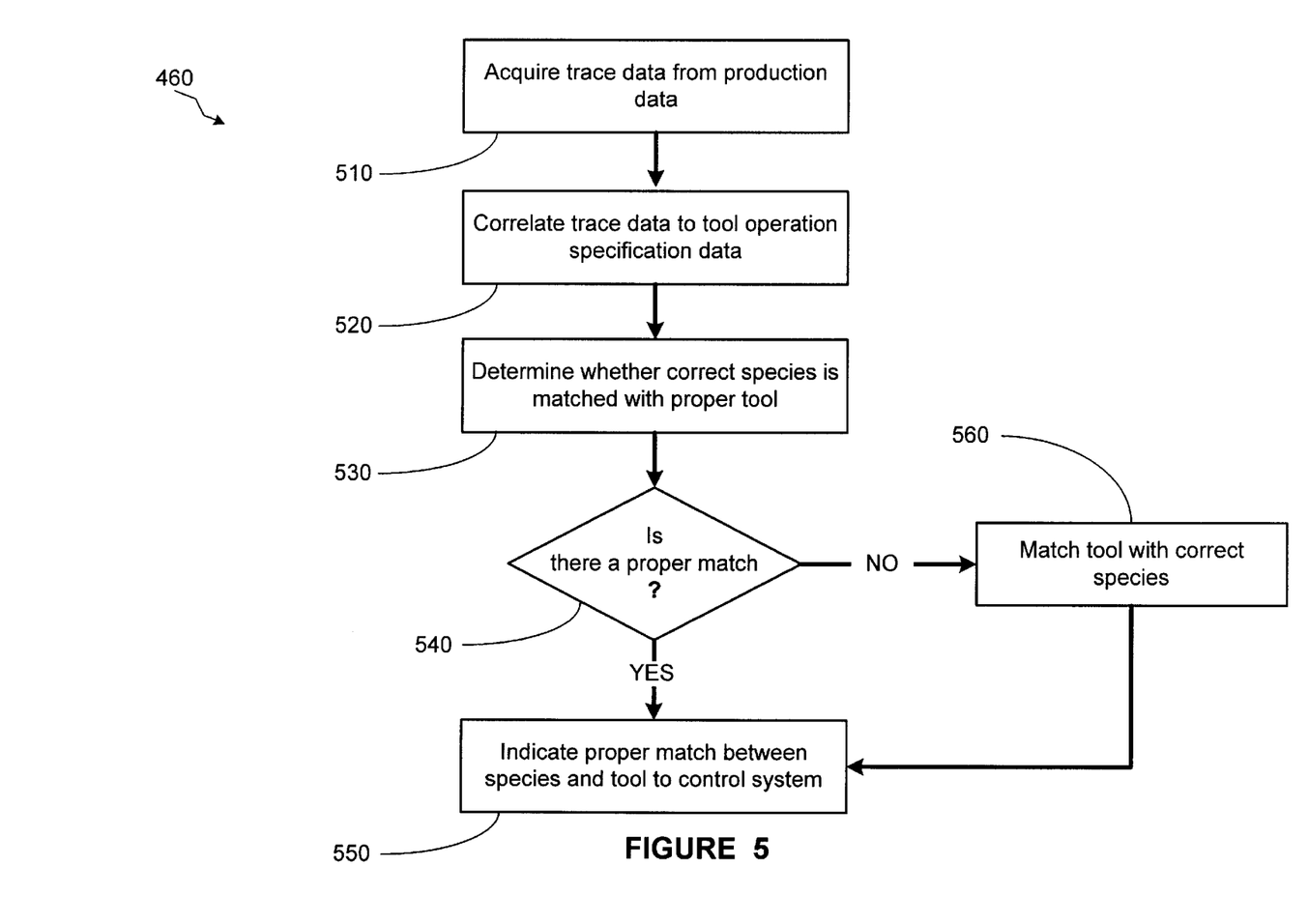
FIG. 5 illustrates a flowchart representation of a more detailed depiction of the step of performing verification of the process species described in FIG. 4.

Turning now to FIG. 5, trace data from the production data is acquired, as described in block 510 of FIG. 5. In one embodiment, one set of trace data from an implant species includes a current measurement that correlates to the concentration of the dosage of the implant material. In one embodiment, the current measurement relates to a analyzer magnet current. In one embodiment, an implant species is correlated and tuned to the analyzer magnet current. Generally, an implanter tunes to a given species by submitting the extracted ion beam to a magnetic field.

Once the trace data is acquired from the production data, the trace data is correlated to the tool operation specification data that is acquired for a particular manufacturing process step, as described in block 520 of FIG. 5. The correlation of the trace data and the tool operation specification data is used to determine whether a correct recipe species is matched with a proper processing tool 110, 112, as described in blocks 530 and 540 of FIG. 5.

When a determination is made that the recipe species used is matched properly with the proper processing tool 110, 112, an indication of proper match is sent to a process control system, such as the APC system, as described in block 550 of FIG. 5. When a determination is made that the recipe species used is not matched properly with the proper processing tool 110, 112, the processing tool 110, 112 in question is properly matched with the proper recipe species, as described in block 560 of FIG. 5. Subsequently, an indication of proper match is sent to a process control system, such as the APC system, as described in block 550 of FIG. 5. In one embodiment, the matching of the processing tool 110, 112 to the proper recipe species is performed automatically by a computer program that, in one embodiment, is integrated with a process control system, such as the APC system.

The completion of the steps described in FIG. 5 substantially indicates the completion of the step of performing recipe management analysis described in block 340 of FIG. 3. Turning back to FIG. 3, once the step of performing recipe management analysis described in block 340 is substantially completed, processing of a subsequent manufacturing run of semiconductor devices is performed, as described in block 350 of FIG. 3. The principles taught by the present invention can be implemented into other types of manufacturing frameworks.

The principles taught by the present invention can be implemented in an Advanced Process Control (APC) Framework. The APC is a preferred platform from which to implement the recipe management system taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller. The control methods are generally defined and performed in these scripts. The development of these scripts can comprise a significant portion of the development of a control system.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for implementing corrected species by monitoring state parameters in a manufacturing process, comprising:
    performing a process run of semiconductor devices using a processing tool;
    acquiring production data relating to said process run of semiconductor devices;
    storing said acquired production data into a production database; and
    performing a recipe management analysis, wherein said recipe management analysis comprises:
        acquiring tool operation specification data;
        comparing said production data to said tool operation specification data; and
        modifying a process recipe for said processing tool in using a database in response to said comparison of said production data to said tool operation specification data.

2. The method described in claim 1, wherein performing a process run of semiconductor devices further comprises performing an implant process on said semiconductor devices.

3. The method described in claim 1, wherein performing a process run of semiconductor devices further comprises performing a photolithography process on said semiconductor devices.

4. The method described in claim 1, wherein performing a process run of semiconductor devices further comprises performing a deposition process on said semiconductor devices.

5. The method described in claim 1, wherein performing a process run of semiconductor devices further comprises performing a chemical-mechanical polishing process on said semiconductor devices.

6. The method described in claim 1, wherein acquiring production data relating to said process run of semiconductor devices further comprises acquiring metrology data.

7. The method described in claim 1, wherein performing a recipe management analysis further comprises:
    determining whether a result of said comparison of said production data to said tool operation specification data is within a predetermined tolerance level;
    modifying a process recipe in response to said determination that said result of said comparison of said production data to said tool operation specification data is not within a predetermined tolerance level;
    modifying at least one control setting in response to said determination that said result of said comparison of said production data to said tool operation specification data is not within a predetermined tolerance level; and
    performing a recipe species analysis in response to said determination that said result of said comparison of said production data to said tool operation specification data is not within a predetermined tolerance level.

8. The method described in claim 7, wherein performing a recipe management analysis further comprises performing a recipe management analysis using a manufacturing control system.

9. The method described in claim 8, wherein performing a recipe management analysis using a manufacturing control system further comprises performing a recipe management analysis using a Automatic Process Control framework.

10. The method described in claim 7, wherein acquiring tool operation specification data further comprises acquiring recipe settings and control input settings.

11. The method described in claim 7, wherein performing a recipe species analysis further comprises:
    acquiring trace data from said production data;
    correlating said trace data to said tool operation specification data;
    determining whether said recipe species matches a process tool used for processing of semiconductor devices;
    indicating a proper match in response to a determination that said recipe species matches a process tool used for processing of semiconductor devices; and
    performing a match between said process tool and a recipe species.

12. The method described in claim 11, wherein acquiring trace data from said production data further comprises acquiring a current signal that indicates the amount of doping concentration material used for a processing step.

13. The method described in claim 12, wherein acquiring a current signal further comprises acquiring an analyzer magnet current.

14. A method for implementing corrected species by monitoring state parameters in a manufacturing process, comprising:
    performing a process run of semiconductor devices using a processing tool;
    acquiring production data relating to said process run of semiconductor devices;
    storing said acquired production data into a production database; and
    performing a recipe management analysis, wherein said recipe management analysis comprises:
        determining whether a result of said comparison of said production data to said tool operation specification data is within a predetermined tolerance level;
        modifying a process recipe for said processing tool in response to said determination that said result of said comparison of said production data to said tool operation specification data is not within a predetermined tolerance level;
        modifying at least one control setting for said processing tool in response to said determination that said result of said comparison of said production data to said tool operation specification data is not within a predetermined tolerance level; and
        performing a recipe species analysis for said processing tool in response to said determination that said result of said comparison of said production data to said tool operation specification data is not within a predetermined tolerance level.

15. The method described in claim 14, wherein performing a recipe species analysis further comprises:

acquiring trace data from said production data;

correlating said trace data to said tool operation specification data;

determining whether said recipe species matches a process tool used for processing of semiconductor devices;

indicating a proper match in response to a determination that said recipe species matches a process tool used for processing of semiconductor devices; and performing a match between said process tool and a recipe species.

16. The method described in claim 15, wherein acquiring trace data from said production data further comprises acquiring a current signal that indicates the amount of doping concentration material used for a processing step.

17. The method described in claim 16, wherein acquiring a current signal further comprises acquiring an analyzer magnet current.

\* \* \* \* \*

UNITED STATES PATENT AND TRADEMARK OFFICE
CERTIFICATE OF CORRECTION

PATENT NO. : 6,465,263 B1
DATED : October 15, 2002
INVENTOR(S) : Elfido Coss, Jr., Thomas Sonderman and Robert W. Anderson It is certified that error appears in the above-identified patent and that said Letters Patent is hereby corrected as shown below:

Column 7,
Line 39, delete the word "in" after the words "processing tool."

Signed and Sealed this

Seventh Day of September, 2004

JON W. DUDAS
*Director of the United States Patent and Trademark Office*